United States Patent
Ikemoto

(10) Patent No.: US 9,320,158 B2
(45) Date of Patent: Apr. 19, 2016

(54) VEHICLE CONTROL DEVICE

(75) Inventor: Minoru Ikemoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 74 days.

(21) Appl. No.: 13/985,720

(22) PCT Filed: Mar. 7, 2011

(86) PCT No.: PCT/JP2011/055208
§ 371 (c)(1),
(2), (4) Date: Aug. 15, 2013

(87) PCT Pub. No.: WO2012/120610
PCT Pub. Date: Sep. 13, 2012

(65) Prior Publication Data
US 2013/0320826 A1    Dec. 5, 2013

(51) Int. Cl.
*H05K 7/20* (2006.01)
*H05K 5/02* (2006.01)
*B61C 17/00* (2006.01)

(52) U.S. Cl.
CPC .............. *H05K 5/0213* (2013.01); *B61C 17/00* (2013.01); *H05K 7/2089* (2013.01); *H05K 7/20127* (2013.01)

(58) Field of Classification Search
CPC . H05K 7/20; H05K 7/20009; H05K 7/20127; H05K 7/2039; H05K 7/20409; H05K 7/20418; B60K 11/06
See application file for complete search history.

(56) References Cited

U.S. PATENT DOCUMENTS

| 4,976,327 | A | * | 12/1990 | Abujudom, II | ......... | B60R 16/04 180/68.2 |
| 5,542,489 | A | * | 8/1996 | Allison | ................... | B60R 16/04 180/68.5 |
| 6,828,755 | B1 | * | 12/2004 | Iverson | ................. | H01M 16/00 320/104 |

(Continued)

FOREIGN PATENT DOCUMENTS

| DE | 2757282 A1 | * | 7/1979 | ......... H05K 7/20518 |
| DE | 3717009 A1 | * | 12/1988 | ........... H04B 1/3822 |

(Continued)

OTHER PUBLICATIONS

Office Action (First) issued on Feb. 28, 2015, by the Chinese Patent Office in corresponding Chinese Patent Application No. 201180069019.6 with English translation thereof. (10 pgs).

(Continued)

*Primary Examiner* — Katy M Ebner
(74) *Attorney, Agent, or Firm* — Buchanan Ingersoll & Rooney PC

(57) ABSTRACT

A vehicle control device includes a casing that is mounted on a vehicle of an electric vehicle, a machine installing chamber that is provided in the casing and in which a machine that controls the electric vehicle is installed, an air circulating chamber that is provided on a vehicle center side in the casing, a partition plate in which a first through hole that is formed on a side of a top surface of the casing and allows an air a in the machine installing chamber to flow in the air circulating chamber and a second through hole that is formed on a side of a bottom surface of the casing and allows an air in the air circulating chamber to flow in the machine installing chamber are formed, and a radiator radiates heat of an air that flows via the first through hole in the air circulating chamber.

10 Claims, 6 Drawing Sheets

(56) References Cited

U.S. PATENT DOCUMENTS

| | | | |
|---|---|---|---|
| 7,045,236 B1* | 5/2006 | Andrew | H01M 2/1077 429/83 |
| 7,231,994 B2* | 6/2007 | Buglione | B60K 6/26 180/65.31 |
| 8,035,964 B2* | 10/2011 | Biagini | H05K 7/20918 165/185 |
| 8,556,017 B2* | 10/2013 | Kubota | B60K 1/04 180/68.1 |
| 2003/0047366 A1* | 3/2003 | Andrew | B60L 3/0046 180/68.5 |
| 2004/0094115 A1* | 5/2004 | Jatzke | H05K 7/20009 123/198 E |
| 2004/0169956 A1* | 9/2004 | Oba | G06F 1/20 360/97.15 |
| 2010/0254087 A1 | 10/2010 | Godfroy et al. | |
| 2015/0146380 A1* | 5/2015 | Lu | H05K 7/1432 361/709 |

FOREIGN PATENT DOCUMENTS

| | | | | |
|---|---|---|---|---|
| DE | 102004030457 | * | 1/2006 | H02M 7/003 |
| DE | 102008037372 | * | 4/2010 | H05K 7/20127 |
| JP | 8-192654 A | | 7/1996 | |
| JP | 10-212949 A | | 8/1998 | |
| JP | 2001-114100 A | | 4/2001 | |
| JP | 2005-223277 A | | 8/2005 | |
| JP | 2006-304466 A | | 11/2006 | |
| JP | 2007-95975 A | | 4/2007 | |

OTHER PUBLICATIONS

*International Search Report (PCT/ISA/210) issued on May 24, 2011, by the Japanese Patent Office as the International Searching Authority for International Application No. PCT/JP2011/055208.

*Written Opinion (PCT/ISA/237) issued on May 24, 2011, by the Japanese Patent Office as the International Searching Authority for International Application No. PCT/JP2011/055208.

* cited by examiner

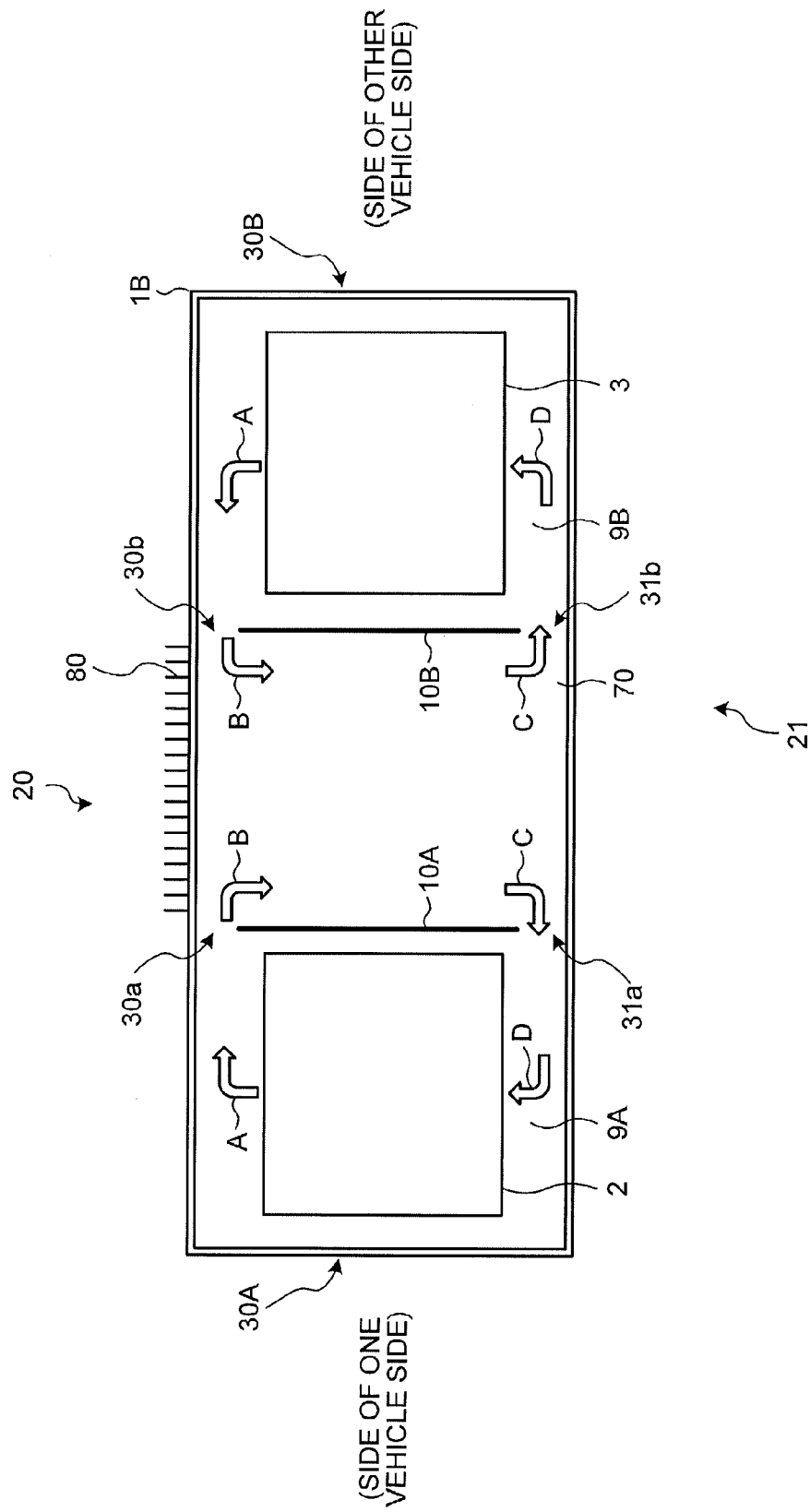

VEHICLE CONTROL DEVICE

FIELD

The present invention relates to a vehicle control device that is mounted under a floor of an electric vehicle.

BACKGROUND

A conventional vehicle control device is configured by various machines including a power conversion device such as a so-called inverter that uses an electric-power semiconductor device and the like, a fin for effectively radiating heat generated from each machine, and the like. Meanwhile, as a recent technical trend, a switching element based on silicon carbide (SiC) that has a high voltage resistance and a low loss and that can operate at a high current, a high temperature, and a high frequency has attracted attention. When a power conversion device is configured by using this switching element, an operation at a high temperature is possible and thus an increase in the temperature of a casing of a vehicle control device (hereinafter, "casing") tends to be large.

According to a conventional technique represented by Patent Literature 1 mentioned below, there have been employed methods such as that of releasing heat generated from a power conversion device to outside thereof by using a radiation fin, and that of reducing the temperature in a casing by using an air circulating fan and the like arranged in the device.

CITATION LIST

Patent Literature

Patent Literature 1: Japanese Patent Application Laid-open No. 2005-223277

SUMMARY

Technical Problem

However, the conventional technique described in Patent Literature 1 mentioned above does not disclose any machine arrangement with a consideration of natural convection in a casing (a phenomenon that a high temperature air is moved to the top of a heat generator, while a low temperature air is guided to a heat generator). Accordingly, for example, heat generated from the power conversion device remains in a part thereof, so that a part where a temperature increase is large is generated. Therefore, there is a problem that, for example, the lifetime of a filter capacitor and the like used for the power conversion device is reduced. Meanwhile, when the above method of reducing the temperature in the casing by using a fan is used, there is a problem that an empty space in the vehicle control device is reduced, and the temperature in the casing is increased by heat generated from the fan itself, and along with the temperature increase, the lifetime of the fan itself, the lifetime of the filter capacitor mentioned above, and the like are reduced.

The present invention has been achieved in view of the above problems, and an object of the present invention is to provide a vehicle control device that can suppress a decrease in the lifetime of a machine without using any fan.

Solution to Problem

In order to solve the above problem and in order to attain the above object, a vehicle control device of the present invention includes: a casing that is mounted on a vehicle of an electric vehicle; a machine installing chamber that is provided on a side of a vehicle side in the casing and in which a machine that controls the electric vehicle is installed; an air circulating chamber that is provided on a vehicle center side in the casing; a partition plate that is provided between the machine installing chamber and the air circulating chamber and in which a first through hole that is formed on a side of a top surface of the casing and allows an air in the machine installing chamber to flow in the air circulating chamber and a second through hole that is formed on a side of a bottom surface of the casing and allows an air in the air circulating chamber to flow in the machine installing chamber are formed; and a radiator that is provided on a top of the air circulating chamber and radiates heat of an air that flows via the first through hole in the air circulating chamber by a traveling wind of the electric vehicle.

ADVANTAGEOUS EFFECTS OF INVENTION

According to the present invention, because a natural convection effect based on the temperature difference between an air heated in a machine installing chamber and an air cooled in an in-casing air-circulating chamber is utilized, a decrease in the lifetime of a machine can be suppressed without using any fan.

BRIEF DESCRIPTION OF DRAWINGS

FIG. 7 is a cross-sectional diagram along a line B-B of FIG. 6.

DESCRIPTION OF EMBODIMENTS

Exemplary embodiments of a vehicle control device according to the present invention will be explained below in detail with reference to the accompanying drawings. The present invention is not limited to the embodiments.

First Embodiment

Figure 1:
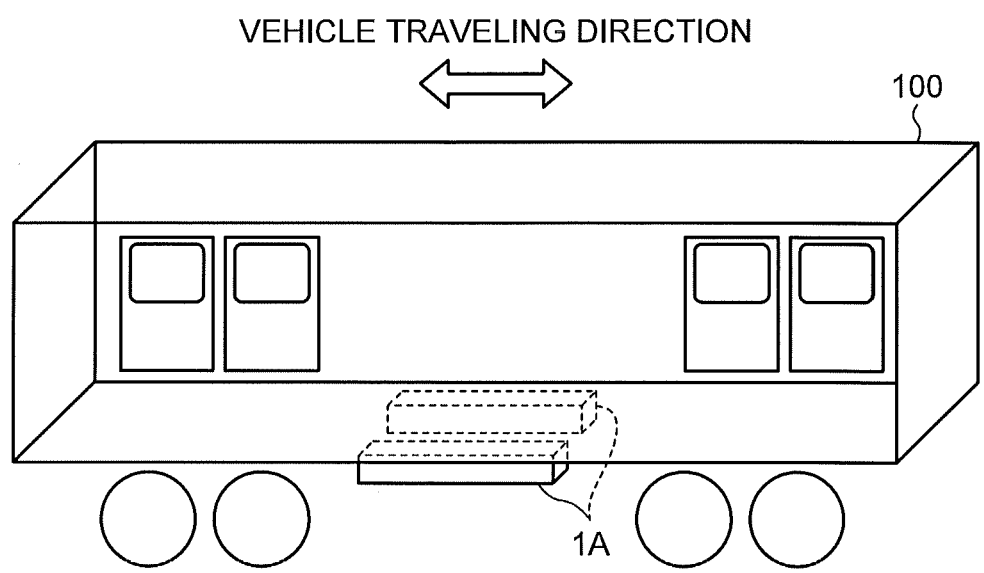
FIG. 1 is a schematic diagram of a vehicle having a vehicle control device according to a first embodiment of the present invention incorporated therein.
Figure 2:
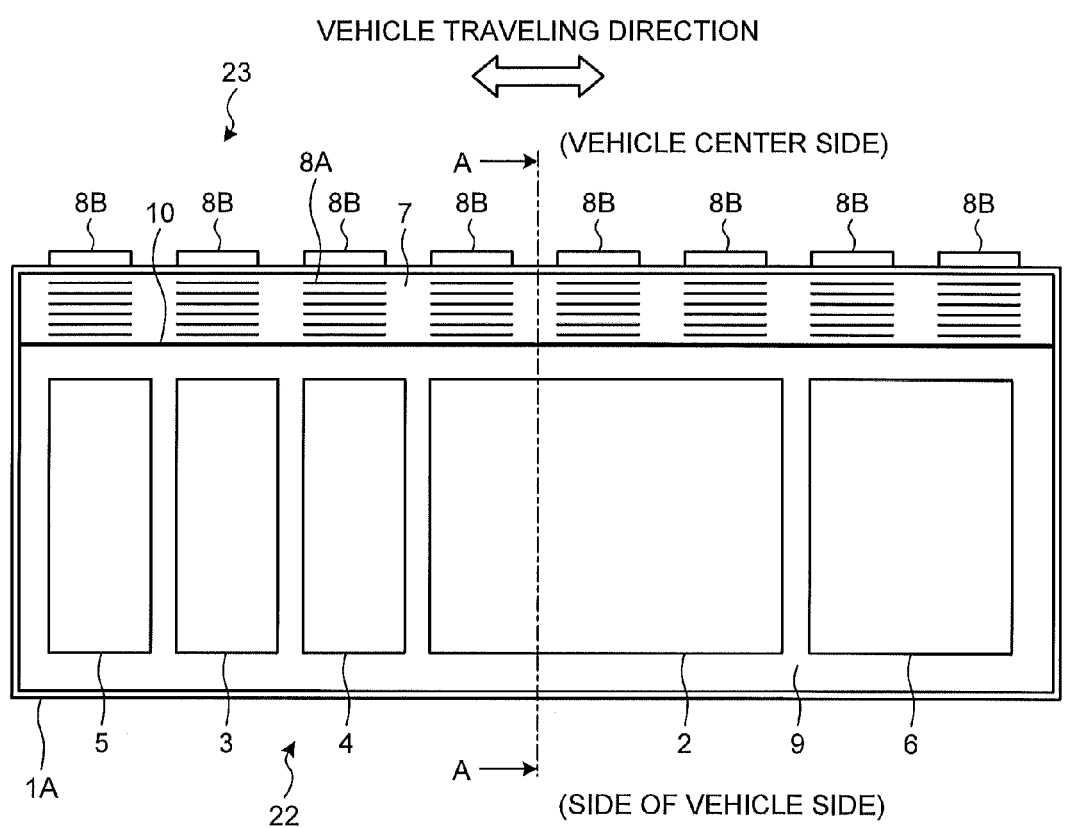
FIG. 2 depicts a configuration of the vehicle control device shown in FIG. 1.
Figure 3:
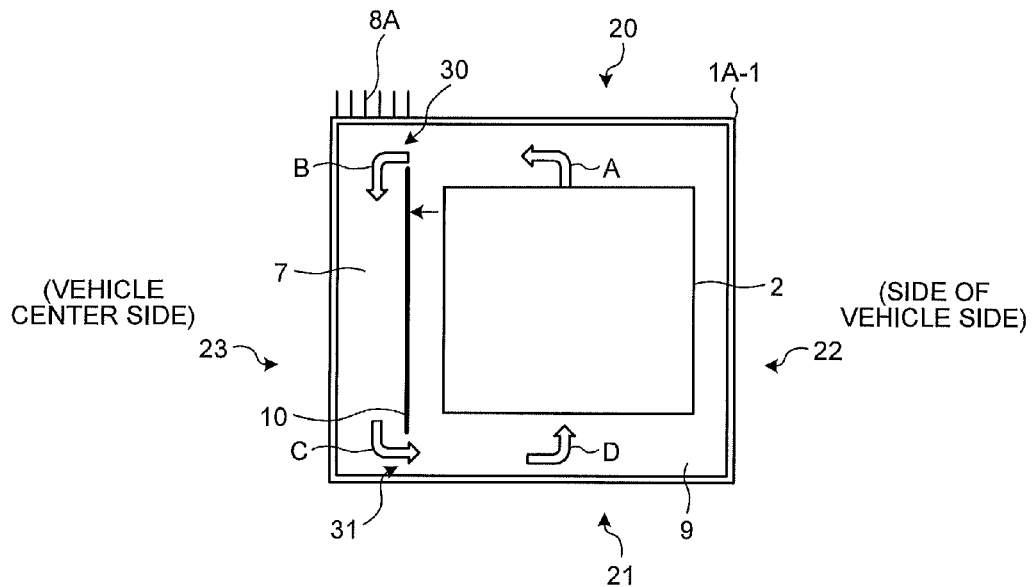
FIG. 3 is a cross-sectional diagram along a line A-A of FIG. 2.
Figure 4:
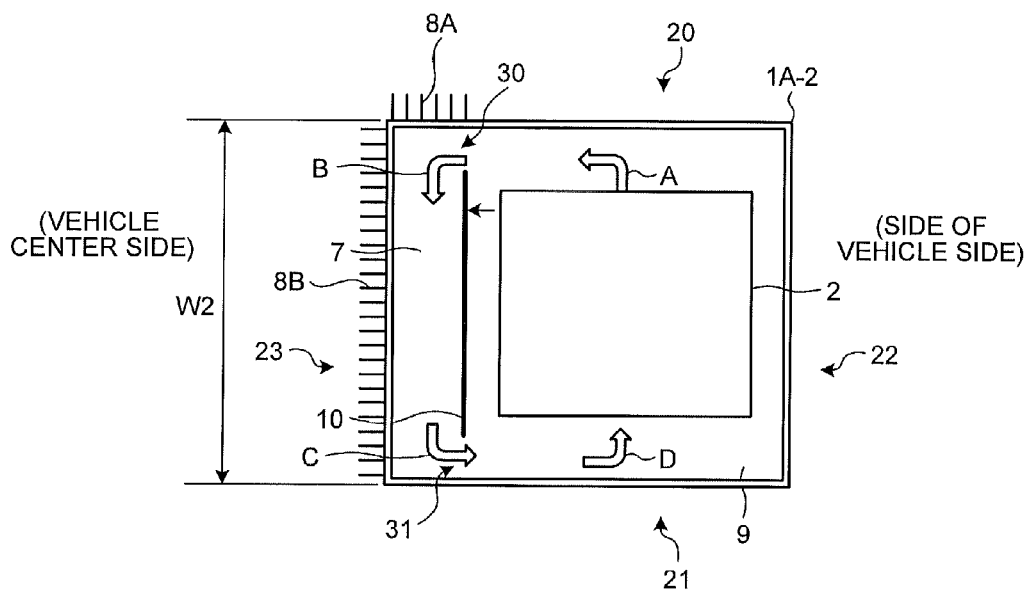
FIG. 4 is another cross-sectional diagram along the line A-A of FIG. 2.

FIG. 1 is a schematic diagram of a vehicle 100 having a vehicle control device according to a first embodiment of the present invention incorporated therein, FIG. 2 depicts a configuration of the vehicle control device shown in FIG. 1, FIG. 3 is a cross-sectional diagram along a line A-A of FIG. 2, and FIG. 4 is another cross-sectional diagram along the line A-A of FIG. 2.

FIG. 1 depicts the vehicle 100 that constitutes a formation of an electric vehicle (for example, a train) and a casing 1A of the vehicle control device (hereinafter, simply "casing") that is mounted under a floor of the vehicle 100. This casing 1A is formed in a rectangular shape that is long in a traveling direction of the electric vehicle and short on a side of a vehicle side, and is, for example, respectively arranged on a side of one vehicle side and a side of the other vehicle side under the floor of the vehicle 100.

FIG. 2 depicts the casing 1A as viewed from a side of the vehicle 100 toward a railroad track side and an internal configuration of the vehicle control device. A first casing side-surface 22 of the casing 1A is on a side of a vehicle side of the vehicle 100 and a second casing side-surface 23 of the casing 1A is on a central side of the vehicle 100.

A machine installing chamber 9 that is formed on the side of the vehicle side, an in-casing air-circulating chamber (hereinafter, "circulating chamber") 7 that is a space formed on the vehicle center side, and a plate-shaped partition plate 10 that is provided between the machine installing chamber 9 and the circulating chamber 7 are provided in the casing 1A. As shown in FIG. 3, a first through hole 30 and a second through hole 31 are formed in the partition plate 10. The first through hole 30 is formed on a top surface side of the casing 1A and allows an air in the machine installing chamber 9 to flow in the circulating chamber 7. The second through hole 31 is formed on a bottom surface side of the casing 1A and allows an air in the circulating chamber 7 to flow in the machine installing chamber 9.

A radiation fin 8A is provided on a top surface of the circulating chamber 7 along the traveling direction of the electric vehicle. A radiation fin 8B is provided on the second casing side-surface 23 on the vehicle center side along the traveling direction of the electric vehicle. The radiation fins 8A and 8B are a radiation fin for cooling an air B immediately after flowing in the circulating chamber 7. As shown in FIG. 2, a plurality of the radiation fins 8A and 8B are respectively provided in the traveling direction of the electric vehicle at a predetermined distance therebetween.

The circulating chamber 7 is a space used when a machine such as a power conversion device 2 is assembled. For example, wires connected to various machines including the power conversion device 2 shown in FIG. 2 and the like are laid in the circulating chamber 7. The power conversion device 2 and the like are checked by opening a checking door (not shown) provided on the first casing side-surface 22.

As an example, a sensor 5, a switchgear 3, an overvoltage suppression unit 4, the power conversion device 2, and a control unit 6 are arranged in the machine installing chamber 9. The sensor 5 monitors a voltage and a current that are input and output to and from the vehicle control device. The switchgear 3 performs electric connection and disconnection to and from an overhead line (not shown). The overvoltage suppression unit 4 includes a switching unit and a resistor (both not shown) to suppress an overvoltage. The power conversion device 2 is configured by a switching element (not shown) that is formed by silicon (Si), for example. The control unit 6 controls the entire vehicle control device.

A switching element that configures the power conversion device 2 is not limited to a switching element formed by silicon (Si) and can be formed by a wide bandgap semiconductor having a larger bandgap than silicon. Examples of such semiconductors referred to as "wide bandgap semiconductor" include silicon carbide (SiC), gallium nitride (GaN), and diamond. Because a switching element formed by such a wide bandgap semiconductor has a high voltage resistance and a high allowable current density, the switching element can be downsized. By using a downsized switching element, a semiconductor module having the switching element incorporated therein can be downsized. Furthermore, because the wide bandgap semiconductor also has a high heat resistance, the semiconductor module can be further downsized. Further, because the wide bandgap semiconductor has a lower power loss, the efficiency of the switching element can be increased and the efficiency of the semiconductor module can be increased.

When the switching element formed by the wide bandgap semiconductor is used for the power conversion device 2, a high temperature air generated from the switching element remains in a part of the machine installing chamber 9, so that the lifetime of a filter capacitor and the like used for the power conversion device 2 may be reduced.

According to the vehicle control device of the first embodiment, to suppress such heat-remaining, as shown in FIGS. 3 and 4, the radiation fins 8A and 8B are arranged on a side of the circulating chamber 7, that is, on the vehicle center side with respect to an extended line of ends of the partition plate 10. This configuration is explained below in detail with reference to FIGS. 3 and 4.

A casing 1A-1 shown in FIG. 3 is an example of the casing 1A shown in FIG. 2, and only the radiation fin 8A is arranged in the casing 1A-1 as an example.

FIG. 3 depicts the power conversion device 2, an air A heated by the power conversion device 2, the air B that flows from the machine installing chamber 9 in the circulating chamber 7 and then flows down toward a side of a casing bottom surface 21, an air C that flows from the circulating chamber 7 in the machine installing chamber 9, and an air D that flows from the circulating chamber 7 in the machine installing chamber 9. While FIG. 3 depicts the power conversion device 2 that generates the largest amount of heat among various machines for convenience of explanation, a flow of the airs A to D in a case where the power conversion device 2 is used is the same as that in a case where the power conversion device 2 is replaced by a machine other than the power conversion device 2.

As shown in FIG. 3, the partition plate 10 is interposed between the machine installing chamber 9 and the circulating chamber 7. The first through hole 30 is formed on a side of a casing top surface 20 of the partition plate 10, and the second through hole 31 is formed on a side of the casing bottom surface 21 of the partition plate 10. A relationship between the first through hole 30, the second through hole 31, the radiation fin 8A, and the flow of the airs A to D is specifically explained below.

The air A heated by the power conversion device 2 rises to the casing top surface 20 and flows along an inner side of the casing top surface 20 (an inner circumferential surface of the casing 1A-1) toward the side of the circulating chamber 7. When the first through hole 30 is formed near the center of the partition plate 10, a flow of the air B from the machine installing chamber 9 to the circulating chamber 7 is blocked. Therefore, according to the vehicle control device of the first embodiment, the first through hole 30 is formed on the side of the casing top surface 20 (that is, between an inner circumferential surface of the casing top surface 20 and the partition plate 10) so as not to block the flow of the air B to the circulating chamber 7.

The air B that flows in the circulating chamber 7 flows down toward the side of the casing bottom surface 21 while being cooled in the circulating chamber 7. When the second through hole 31 is formed near the center of the partition plate 10, the air C cooled in the circulating chamber 7 is not guided to a bottom surface side of the power conversion device 2 but flows in a side surface side of the power conversion device 2 (between the power conversion device 2 and the partition plate 10). In this case, heat may remain between the power conversion device 2 and the casing bottom surface 21 or between the power conversion device 2 and the first casing side-surface 22. According to the vehicle control device of the first embodiment, to suppress such air-remaining, the second through hole 31 is formed on the side of the casing bottom surface 21 (between the casing bottom surface 21 and the partition plate 10).

Next, the reason why any radiation fin is not provided on a side of the machine installing chamber 9 (on a side of a vehicle side with respect to an extended line of ends of the partition plate 10) is explained.

As explained above, the vehicle control device according to the first embodiment is configured so as to positively utilize a natural convection effect based on a temperature difference for effectively cooling a machine that generates heat. When the temperature of the air A having absorbed heat of the power conversion device 2 is 80° C., for example, this air A flows along the casing top surface 20 on the side of the machine installing chamber 9 into the circulating chamber 7. As shown in FIG. 3, because the radiation fin 8A is arranged on a top surface of the circulating chamber 7, heat of the air B having flown in the circulating chamber 7 is absorbed by the radiation fin 8A and the air B is cooled to approximately 60° C., for example. Accordingly, the temperature difference between the air B immediately after flowing in the circulating chamber 7 and the air C immediately before flowing in the machine installing chamber 9 is approximately 20° C. The air C cooled in the circulating chamber 7 then flows via the second through hole 31 in the machine installing chamber 9. The air D having flown in the machine installing chamber 9 is transported to an upper side of the power conversion device 2 while absorbing heat of the power conversion device 2, and guided again to the first through hole 30 as the air A.

Because any radiation fin is not provided on the side of the machine installing chamber 9, the air A is hardly cooled in the machine installing chamber 9, but the air B having flown in the circulating chamber 7 is cooled by the radiation fin 8A and thus the temperature difference between the air B and the air C is approximately 20° C. Accordingly, an air in the casing 1A-1 circulates by the natural convection effect based on the temperature difference through the machine installing chamber 9, the first through hole 30, the circulating chamber 7, and the second through hole 31 in this order. As a result, heat-remaining in the machine installing chamber 9 is suppressed.

On the other hand, when a radiation fin is provided on the side of the machine installing chamber 9, the natural convection effect is reduced. This configuration is specifically explained below.

When the temperature of the air A immediately after absorbing heat of the power conversion device 2 is 80° C., for example, this air A is cooled to approximately 70° C., for example, by a radiation fin (not shown) that is provided on a top surface of the machine installing chamber 9 and then flows in the circulating chamber 7. As explained above, heat of the air B having flown in the circulating chamber 7 is absorbed by the radiation fin 8A and cooled to approximately 60° C., for example. Accordingly, the temperature difference between the air B immediately after flowing in the circulating chamber 7 and the air C is approximately 10° C. Therefore, when a radiation fin is provided on the side of the machine installing chamber 9, the temperature difference between the air B and the air C becomes smaller as compared to a case where the radiation fin 8A is provided on a top side of the circulating chamber 7, and thus the natural convection effect is reduced.

Next, a configuration example that can further improve the natural convection effect is explained. A casing 1A-2 shown in FIG. 4 is an example of the casing 1A shown in FIG. 2. As shown in FIG. 4, the radiation fin 8A is provided on the top surface of the circulating chamber 7 and the radiation fin 8B is provided on the second casing side-surface 23 on the vehicle center side. In the following descriptions, elements of the casing 1A-2 that are identical to those of the casing 1A-1 shown in FIG. 3 are denoted by like reference signs and explanations thereof will be omitted, and only elements of the casing 1A-2 that are different from those of the casing 1A-1 are described.

When the temperature of the air A having absorbed heat of the power conversion device 2 is 80° C., for example, this air A flows along the casing top surface 20 on the side of the machine installing chamber 9 into the circulating chamber 7. Heat of the air B having flown in the circulating chamber 7 is absorbed by the radiation fin 8A and by the second casing side-surface 23 and the like before reaching the second through hole 31. Because the radiation fin 8B is arranged on the second casing side-surface 23, heat of the air B is cooled to approximately 55° C., for example. Accordingly, an air in the casing 1A-2 circulates by the natural convection effect based on the temperature difference (approximately 25° C.) between the air B immediately after flowing in the circulating chamber 7 and the air C. In this manner, by arranging the radiation fin 8B that is formed in a size substantially equal to a width W2 from the casing top surface 20 to the casing bottom surface 21 and the radiation fin 8A, the natural convection effect can be increased as compared to a case where only the radiation fin 8A is arranged.

With reference to FIG. 4, the radiation fin 8B is arranged on the entire second casing side-surface 23 as an example. However, for example, when it is configured so that the radiation fin 8B is provided only on an upper side of the second casing side-surface 23 (an upper side with respect to a line that horizontally extends from near the center of the casing 1A-2), as compared to a case where only the radiation fin 8A is provided, the air B having flown in the circulating chamber 7 can be further cooled and as compared to a case where the radiation fin 8B is provided on the entire second casing side-surface 23, the number of radiation fins is reduced, so that the weight and the cost of the vehicle control device can be reduced.

As explained above, the vehicle control device includes the casing 1A that is mounted on the vehicle 100 of an electric vehicle, the machine installing chamber 9 that is provided on a side of a vehicle side in the casing 1A and in which a machine that controls the electric vehicle is installed, the circulating chamber 7 that is provided on a vehicle center side in the casing 1A, the partition plate 10 that is provided between the machine installing chamber 9 and the circulating chamber 7 and in which the first through hole 30 that is formed on a top surface side of the casing 1A and allows the air A in the machine installing chamber 9 to flow in the circulating chamber 7 and the second through hole 31 that is formed on a bottom surface side of the casing 1A and allows the air C in the circulating chamber 7 to flow in the machine installing chamber 9 are formed, and the radiators 8A and 8B that are provided on a top of the circulating chamber 7 and radiate heat of the air B that flows via the first through hole 30 in the circulating chamber 7 by a traveling wind of the electric vehicle. Accordingly, the temperature difference between the air B immediately after flowing in the circulating chamber 7 and the air C can be increased and the airs A to D in the casing 1A circulate by a natural convection effect based on the temperature difference. Therefore, heat generated from a machine such as the power conversion device 2 does not remain in a part thereof. As a result, it is possible to suppress a decrease in the lifetime of a filter capacitor and the like used for the power conversion device 2.

According to the vehicle control device of the first embodiment, even when a fan and the like are not installed in the casing 1A, the airs A to D in the casing 1A can be circulated. Accordingly, an empty space in the vehicle control device is not reduced and an increase in the temperature in a casing due to heat generated from a fan can be prevented. As a result, it is possible to suppress a decrease in the lifetime of the filter capacitor described above and the like and the casing 1A can be downsized.

Second Embodiment

Figure 5:
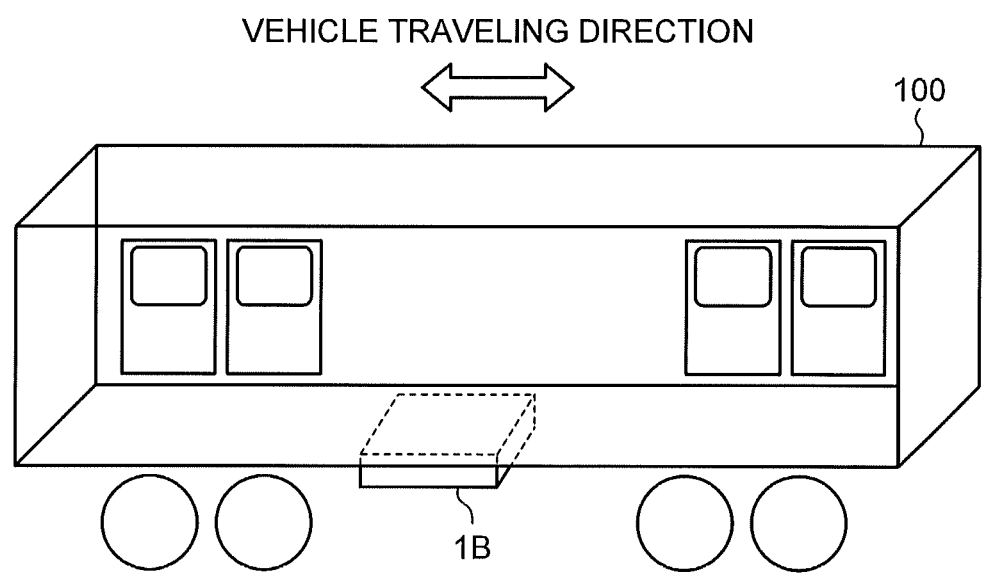
FIG. 5 is a schematic diagram of a vehicle having a vehicle control device according to a second embodiment of the present invention incorporated therein.
Figure 6:
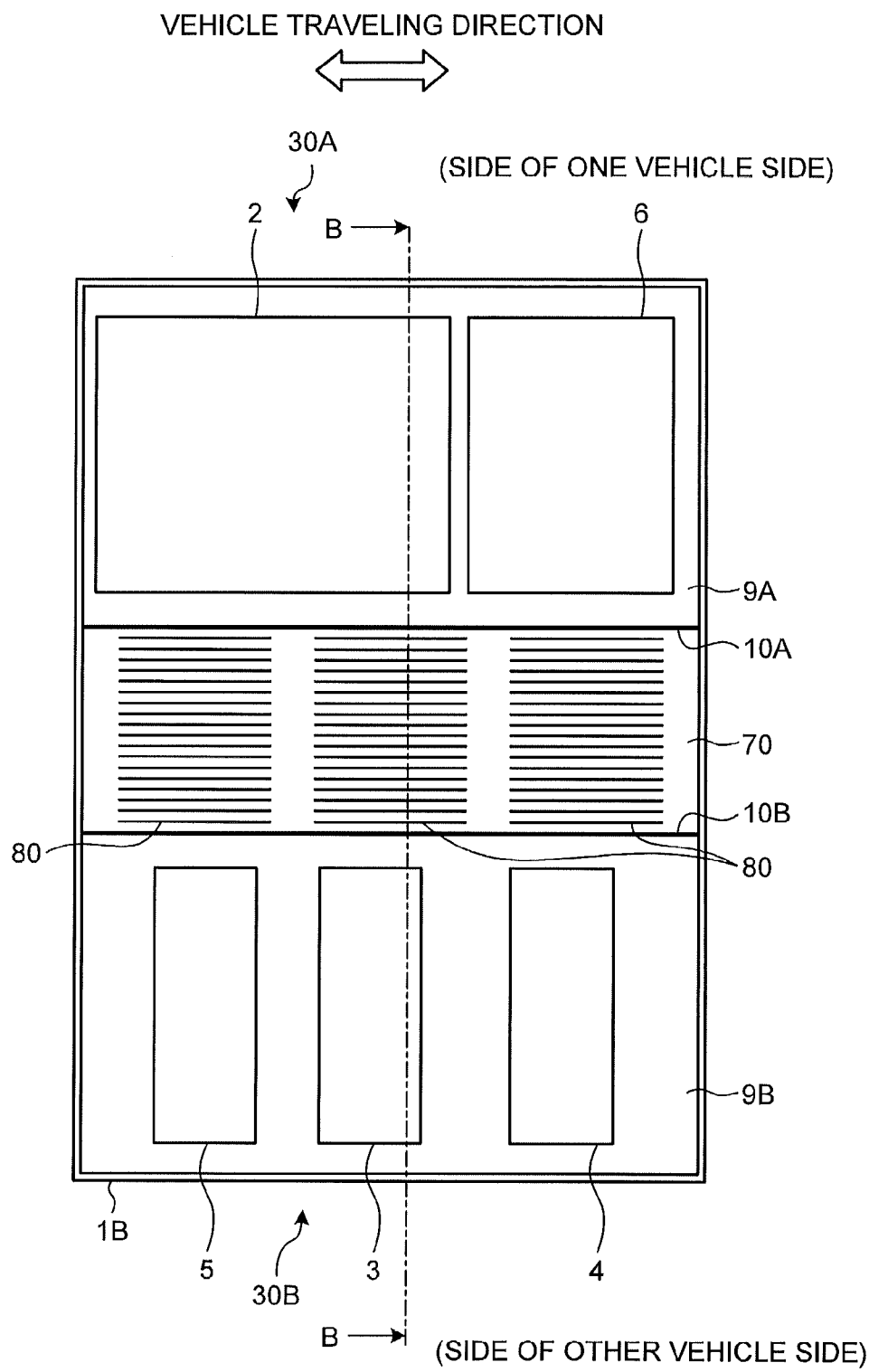
FIG. 6 depicts a configuration of the vehicle control device shown in FIG. 5.

FIG. 5 is a schematic diagram of the vehicle 100 having a vehicle control device according to a second embodiment of the present invention incorporated therein. FIG. 6 depicts a configuration of the vehicle control device shown in FIG. 5. FIG. 7 is a cross-sectional diagram along a line B-B of FIG. 6. The vehicle control device according to the second embodiment is different from the vehicle control device according to the first embodiment in the shape of casing and the position to which a radiation fin is mounted. In the following descriptions, elements of the present embodiment that are identical to those of the first embodiment are denoted by like reference signs and explanations thereof will be omitted, and only elements of the present embodiment that are different from those of the first embodiment are described.

FIG. 5 depicts a casing 1B of the vehicle control device that is mounted under the floor of the vehicle 100. The casing 1B is formed in a rectangular shape that is long in a transverse width direction and short in a traveling direction of the vehicle 100.

FIG. 6 depicts the casing 1B as viewed from a side of the vehicle 100 toward a railroad track side and an internal configuration of the vehicle control device. A first casing side-surface 30A of the casing 1B is on a side of one vehicle side of the vehicle 100 and a second casing side-surface 30B is on a side of the other vehicle side of the vehicle 100.

A first machine installing chamber 9A that is formed on a side of the first casing side-surface 30A, a second machine installing chamber 9B that is formed on a side of the second casing side-surface 30B, and a circulating chamber 70 that is provided between the first machine installing chamber 9A and the second machine installing chamber 9B are provided in the casing 1B. A first partition plate 10A is provided between the first machine installing chamber 9A and the circulating chamber 70. A first through hole 30a and a second through hole 31a are formed in the first partition plate 10A. The first through hole 30a is formed on a top surface side of the casing 1B and allows the air A in the first machine installing chamber 9A to flow in the circulating chamber 70. The second through hole 31a is formed on a bottom surface side of the casing 1B and allows the air C in the circulating chamber 70 to flow in the first machine installing chamber 9A. A second partition plate 10B is provided between the second machine installing chamber 9B and the circulating chamber 70. A third through hole 30b and a fourth through hole 31B are formed in the second partition plate 10B. The third through hole 30b is formed on the top surface side of the casing 1B and allows the air A in the second machine installing chamber 9B to flow in the circulating chamber 70. A fourth through hole 31b is formed on the bottom surface side of the casing 1B and allows the air C in the circulating chamber 70 to flow in the second machine installing chamber 9B.

Furthermore, the control unit 6, the power conversion device 2, the overvoltage suppression unit 4, the switchgear 3, and the sensor 5 are installed in the casing 1B. The control unit 6 and the power conversion device 2 are installed in the first machine installing chamber 9A shown in FIG. 6. The overvoltage suppression unit 4, the switchgear 3, and the sensor 5 are installed in the second machine installing chamber 9B. In this manner, according to the vehicle control device of the present embodiment, the power conversion device 2 that is configured by a switching element (not shown) formed by, for example, silicon (Si) is provided in either the first machine installing chamber 9A or the second machine installing chamber 9B. Similarly to the power conversion device 2 according to the first embodiment, a switching element that configures the power conversion device 2 is not limited to the switching element formed by silicon (Si) and can be formed by a wide bandgap semiconductor having a larger bandgap than silicon.

Similarly to the circulating chamber 7, the circulating chamber 70 is a space used at the time of an operation of assembling the power conversion device 2 and the like. The power conversion device 2 and the control unit 6 are arranged in the first machine installing chamber 9A. The sensor 5, the switchgear 3, and the overvoltage suppression unit 4 are arranged in the second machine installing chamber 9B.

A radiation fin 80 is provided on a top of the circulating chamber 70 along a traveling direction of an electric vehicle. The radiation fin 80 is a radiation fin for cooling the air B immediately after flowing in the circulating chamber 70. As shown in FIG. 6, a plurality of the radiation fins 80 are provided in the traveling direction of the electric vehicle at a predetermined distance therebetween.

According to the vehicle control device of the second embodiment, to suppress remaining of heat from the power conversion device 2 in a part of the casing 1B, as shown in FIG. 7, the radiation fin 80 is arranged on a side of the circulating chamber 70, that is, between an extended line of the first partition plate 10A and an extended line of the second partition plate 10B (on a vehicle center side). This configuration is explained below in detail with reference to FIG. 7.

FIG. 7 depicts the air A heated by, for example, the power conversion device 2 and the switchgear 3, the air B that flows from the first and second machine installing chambers 9A and 9B in the circulating chamber 70, the air C guided from the circulating chamber 70 to the first and second machine installing chambers 9A and 9B, and the air D that flows from the circulating chamber 70 in the first and second machine installing chambers 9A and 9B. As shown in FIG. 7, the first partition plate 10A is interposed between the first machine installing chamber 9A and the circulating chamber 70, and the second partition plate 10B is interposed between the second machine installing chamber 9B and the circulating chamber 70. The first through hole 30a is formed on a side of the casing top surface 20 of the first partition plate 10A, and the third through hole 30h is formed on the side of the casing top surface 20 of the second partition plate 10B. The second through hole 31a is formed on a side of the casing bottom surface 21 of the first partition plate 10A, and the fourth through hole 31b is formed on the side of the casing bottom surface 21 of the second partition plate 10B.

A relationship between the first and second through holes 30a and 31a, the radiation fin 80, and a flow of the airs A to D is specifically explained below. In the following descriptions, a mode in which the airs A to D circulate between the first machine installing chamber 9A and the circulating chamber 70 is explained, and explanations of a mode in which the airs A to D circulate between the second machine installing chamber 9B and the circulating chamber 70 will be omitted.

The air A heated by the power conversion device 2 rises to the casing top surface 20 and flows along an inner side of the casing top surface 20 (an inner circumferential surface of the casing 1B) toward a side of the circulating chamber 70. When the first through hole 30a and the third through hole 30b are formed near the respective centers of the first partition plate 10A and the second partition plate 10B, a flow of the air B from the first machine installing chamber 9A to the circulating chamber 70 is blocked. Therefore, according to the vehicle control device of the second embodiment, the first through hole 30a and the third through hole 30b are formed on a side of the casing top surface 20 (that is, between an inner circumferential surface of the casing top surface 20 and the first partition plate 10A and the second partition plate 10B) so as not to block the flow of the air B flowing in the circulating chamber 70.

The air B that flows in the circulating chamber 70 is cooled in the circulating chamber 70 and flows down toward a side of the casing bottom surface 21. In this case, when the second through hole 31a and the fourth through hole 31b are formed near the respective centers of the first partition plate 10A and the second partition plate 10B, the air C cooled in the circulating chamber 70 is not guided to a bottom surface side of the power conversion device 2 but flows in a side surface side of the power conversion device 2 (between the power conversion device 2 and the partition plate 10). In this case, heat may remain between the power conversion device 2 and the casing bottom surface 21 or between the power conversion device 2 and the first casing side-surface 30A. According to the vehicle control device of the second embodiment, to suppress such air-remaining, the second through hole 31a and the fourth through hole 31b are formed on the side of the casing bottom surface 21 (between the casing bottom surface 21 and the partition plate 10A). Similarly, the fourth through hole 31b is formed between the casing bottom surface 21 and the partition plate 10B.

Next, the reason why any radiation fin is not provided on a side of the first machine installing chamber 9A is explained.

As explained above, the vehicle control device according to the second embodiment is configured so as to positively utilize a natural convection effect based on the temperature difference between the air B and the air C for effectively cooling a machine that generates heat. When the temperature of the air A having absorbed heat of the power conversion device 2 is 80° C., for example, this air A flows along the casing top surface 20 on the side of the first machine installing chamber 9A into the circulating chamber 70. As shown in FIG. 7, when the radiation fin 80 is arranged on a top surface of the circulating chamber 70, heat of the air B having flown in the circulating chamber 70 is absorbed by the radiation fin 80 and cooled to approximately 60° C., for example. Accordingly, the temperature difference between the air B immediately after flowing in the circulating chamber 70 and the air C immediately before flowing in the first machine installing chamber 9A is approximately 20° C. The air C cooled in the circulating chamber 70 flows via the second through hole 31a in the first machine installing chamber 9A. The air D having flown in the first machine installing chamber 9A absorbs heat of the power conversion device 2 when passing outside or inside the power conversion device 2, and the air D is transported to an upper side of the power conversion device 2, and guided again to the first through hole 30a.

Because any radiation fin is not provided on the side of the first machine installing chamber 9A, the air A is hardly cooled in the first machine installing chamber 9A, but the air B having flown in the circulating chamber 7 is cooled by the radiation fin 80 and thus the temperature difference between the air B and the air C is approximately 20° C. Accordingly, an air in the casing 1B circulates by the natural convection effect based on the temperature difference through the first machine installing chamber 9A, the first through hole 30a, the circulating chamber 70, and the second through hole 31a in this order. As a result, heat-remaining in the first machine installing chamber 9A is suppressed.

On the other hand, when a radiation fin is provided on the side of the first machine installing chamber 9A, the natural convection effect is reduced. This configuration is specifically explained below.

When the temperature of the air A immediately after absorbing heat of the power conversion device 2 is 80° C., for example, this air A is cooled to approximately 70° C., for example, by a radiation fin (not shown) that is provided on a top surface of the first machine installing chamber 9A and then flows in the circulating chamber 70. As explained above, heat of the air B having flown in the circulating chamber 70 is absorbed by the radiation fin 80 to be cooled to approximately 60° C., for example. Accordingly, the temperature difference between the air B immediately after flowing in the circulating chamber 70 and the air C is approximately 10° C. As explained above, when a radiation fin is provided on the side of the first machine installing chamber 9A, the temperature difference between the air B and the air C is reduced as compared to a case where the radiation fin 80 is provided on a top side of the circulating chamber 70, and thus the natural convection effect is reduced.

As explained above, the vehicle control device according to the second embodiment includes the casing 1B that is mounted on a vehicle of an electric vehicle, the first machine installing chamber 9A that is provided on a side of one vehicle side in the casing 1B (on a side of the first casing side-surface 30A) and in which a machine that controls the electric vehicle is installed, the second machine installing chamber 9B that is provided on a side of the other vehicle side in the casing 1B (on a side of the second casing side-surface 30B) and in which a machine that controls the electric vehicle is installed, the circulating chamber 70 that is provided between the first machine installing chamber 9A and the second machine installing chamber 9B, the first partition plate 10A that is provided between the first machine installing chamber 9A and the circulating chamber 70 and in which the first through hole 30a that is formed on a top surface side of the casing 1B and allows the air A in the first machine installing chamber 9A to flow in the circulating chamber 70 and the second through hole 31a that is formed on a bottom surface side of the casing 1B and allows the air C in the circulating chamber 70 to flow in the first machine installing chamber 9A are formed, the second partition plate 10B that is provided between the second machine installing chamber 9B and the circulating chamber 70 and in which the third through hole 30b that is formed on the top surface side of the casing 1B and allows the air A in the second machine installing chamber 9B to flow in the circulating chamber 70 and the fourth through hole 31b that is formed on the bottom surface side of the casing 1B and allows the air C in the circulating chamber 70 to flow in the second machine installing chamber 9B are formed, and a radiator that is provided on a top of the circulating chamber 70 and radiates heat of an air having flown via the first through hole and the third through hole in the circulating chamber 70 by a traveling wind of the electric vehicle. Accordingly, the temperature difference between the air B and the air C can be increased and the airs A to D in the casing 1B circulate by a natural convection effect based on the temperature difference. Heat generated from a machine such as the power conversion device 2 does not remain in a part of the first machine installing chamber 9A or the second machine installing chamber 9B. As a result, it is possible to suppress a decrease in the lifetime of a filter capacitor and the like used for the power conversion device 2. Furthermore, according to the vehicle control device of the second embodiment, even when a fan and the like are not installed in the casing 1B, the airs A to D can be circulated. Accordingly, an empty space in the vehicle control device is not reduced and it is possible to prevent an increase in the temperature in a casing due to heat generated from a fan. As a result, it is possible to suppress a decrease in the lifetime of the filter capacitor described above and the like and the casing 1B can be downsized.

According to the first and second embodiments, a fin-shaped radiator (the radiation fin 8A, the radiation fin 8B, and the radiation fin 8C) is used for cooling the air B having flown in the circulating chambers 7 and 70. However, these radiators are not limited to the fin-shaped radiator as long as they have heat conductivity and are cooled by a traveling wind of the vehicle 100. Further, it is assumed that the through hole (30, 30a, 30b, 31, 31a, and 31b) is formed by machining a part of the partition plate (10, 10A, and 10B) and the shape of the through hole (30, 30a, 30b, 31, 31a, and 31b) is, for example, an ellipse or a rectangle that is long in a traveling direction of an electric vehicle. Further, it suffices that the position of the through hole (30, 30a, 30b, 31, 31a, 31b) with respect to the traveling direction of the electric vehicle is a position that does not block natural convection of the airs A to D.

When the power conversion device 2 according to the first and second embodiments is configured by a switching element that uses a wide bandgap semiconductor, the temperature of the air A heated by the power conversion device 2 becomes higher, and thus the temperature difference between the air B and the air C becomes large and a natural convection effect can be further improved.

INDUSTRIAL APPLICABILITY

As described above, the present invention can be applied to a vehicle control device that is mounted under a floor of an electric vehicle, and is particularly useful as an invention that can suppress a decrease in the lifetime of a machine without using any fan.

REFERENCE SIGNS LIST 1A, 1A-1, 1A-2, 1B casing of vehicle control device
2 power conversion device
3 switchgear
4 overvoltage suppression unit
5 sensor
6 control unit
7, 70 in-casing air-circulating chamber
8A, 8B, 8C radiation fin (radiator)
9 machine installing chamber
9A first machine installing chamber
9B second machine installing chamber
10 partition plate
10A first partition plate
10B second partition plate
20 casing top surface
21 casing bottom surface
22, 30A first casing side-surface
23, 30B second casing side-surface
100 vehicle
30, 30a first through hole
31, 31a second through hole
30b third through hole
31b fourth through hole
A, B, C, D air

The invention claimed is:

1. A vehicle control device comprising:
a casing that is mounted on a vehicle of an electric vehicle;
a machine installing chamber that is provided on a side of a vehicle side in the casing and in which a machine that controls the electric vehicle is installed;
an air circulating chamber that is provided on a vehicle center side in the casing;
a partition plate that is provided between the machine installing chamber and the air circulating chamber and in which a first through hole that is formed on a side of a top surface of the casing and allows an air in the machine installing chamber to flow in the air circulating chamber and a second through hole that is formed on a side of a bottom surface of the casing and allows an air in the air circulating chamber to flow in the machine installing chamber are formed; and
a radiator that is provided on a top of the air circulating chamber and radiates heat of an air that flows via the first through hole in the air circulating chamber by a traveling wind of the electric vehicle.

2. The vehicle control device according to claim 1, wherein the radiator is further provided on a casing side-surface on the vehicle center side along a traveling direction of the electric vehicle.

3. The vehicle control device according to claim 2, wherein the radiator provided on the casing side-surface is provided on an upper side of the casing side-surface.

4. The vehicle control device according to claim 1, wherein
the first through hole is formed between an inner circumferential surface of the top surface of the casing and the partition plate, and
the second through hole is formed between an inner circumferential surface of the bottom surface of the casing and the partition plate.

5. The vehicle control device according to claim 1, wherein the machine installing chamber includes a power conversion device that is configured by a switching element formed by a wide bandgap semiconductor.

6. The vehicle control device according to claim 5, wherein the wide bandgap semiconductor is silicon carbide, a gallium nitride-based material, or diamond.

7. A vehicle control device comprising:
a casing that is mounted on a vehicle of an electric vehicle;
a first machine installing chamber that is provided on a side of one vehicle side in the casing and in which a machine that controls the electric vehicle is installed;
a second machine installing chamber that is provided on a side of the other vehicle side in the casing and in which a machine that controls the electric vehicle is installed;
an air circulating chamber that is provided between the first machine installing chamber and the second machine installing chamber;
a first partition plate that is provided between the first machine installing chamber and the air circulating chamber and in which a first through hole that is formed on a side of a top surface of the casing and allows an air in the first machine installing chamber to flow in the air circulating chamber and a second through hole that is formed on a side of a bottom surface of the casing and allows an air in the air circulating chamber to flow in the first machine installing chamber are formed;
a second partition plate that is provided between the second machine installing chamber and the air circulating chamber and in which a third through hole that is formed on the side of the top surface of the casing and allows an air in the second machine installing chamber to flow in the air circulating chamber and a fourth through hole that is formed on the side of the bottom surface of the casing and allows an air in the air circulating chamber to flow in the second machine installing chamber are formed; and a radiator that is provided on a top of the air circulating chamber and radiates heat of an air that flows via the first through hole and the third through hole in the air circulating chamber by a traveling wind of the electric vehicle.

8. The vehicle control device according to claim 7, wherein the first through hole is formed between an inner circumferential surface of the top surface of the casing and the first partition plate, the second through hole is formed between an inner circumferential surface of the bottom surface of the casing and the first partition plate, the third through hole is formed between the inner circumferential surface of the top surface of the casing and the second partition plate, and the fourth through hole is formed between the inner circumferential surface of the bottom surface of the casing and the second partition plate.

9. The vehicle control device according to claim 7, wherein either the first machine installing chamber or the second machine installing chamber includes a power conversion device that is configured by a switching element formed by a wide bandgap semiconductor.

10. The vehicle control device according to claim 9, wherein the wide bandgap semiconductor is silicon carbide, a gallium nitride-based material, or diamond.

\* \* \* \* \*